(12) United States Patent
Richardson et al.

(10) Patent No.: US 7,651,768 B2
(45) Date of Patent: Jan. 26, 2010

(54) REDUCED WETTING STRING FOR RIBBON CRYSTAL

(75) Inventors: Christine Richardson, Northborough, MA (US); Weidong Huang, Acton, MA (US); Richard Wallace, Acton, MA (US); Daniel Doble, Brookline, MA (US); Scott Reitsma, Shrewsbury, MA (US)

(73) Assignee: Evergreen Solar, Inc., Marlborough, MA (US)

( * ) Notice: Subject to any disclaimer, the term of this patent is extended or adjusted under 35 U.S.C. 154(b) by 0 days.

(21) Appl. No.: 12/200,996

(22) Filed: Aug. 29, 2008

(65) Prior Publication Data

US 2009/0060823 A1    Mar. 5, 2009

Related U.S. Application Data

(60) Provisional application No. 60/969,263, filed on Aug. 31, 2007.

(51) Int. Cl.
*C23D 5/00* (2006.01)

(52) U.S. Cl. ............... 428/367; 428/408; 428/702; 428/698

(58) Field of Classification Search ............ 423/349; 428/367, 408, 702, 698
See application file for complete search history.

(56) References Cited

U.S. PATENT DOCUMENTS

| 4,594,229 | A | 6/1986 | Ciszek et al. | 422/246 |
|---|---|---|---|---|
| 4,627,887 | A * | 12/1986 | Sachs | 117/24 |
| 4,661,200 | A | 4/1987 | Sachs | 156/616 |
| 4,689,109 | A | 8/1987 | Sachs | 156/608 |
| 6,814,802 | B2 | 11/2004 | Wallace, Jr. | 117/23 |
| 7,407,550 | B2 | 8/2008 | Sachs | 117/200 |
| 2008/0134964 | A1 | 6/2008 | Harvey et al. | 117/211 |

FOREIGN PATENT DOCUMENTS

| GB | 2135595 A | 9/1984 |
|---|---|---|
| JP | 58194798 | 12/1983 |
| JP | 62113794 | 5/1987 |

OTHER PUBLICATIONS

T.F. Ciszek, et al., *Filament Materials for Edge-Supported Pulling of Silicon Sheet Crystals*, Solar Energy Research Institute, vol. 129, pp. 2838-2843, Dec. 1982.
J.L. Hurd, et al., *Semicontinuous Edge-Supported Pulling of Silicon Sheets*, Journal of Crystal Growth, vol. 59, pp. 499-506, Oct. 1982.
R.W. Miles, et al., *Photovoltaic solar cells: An Overview of state-of-the-art cell development and environmental issues*, Progress in Crystal Growth and Characterization of Materials, vol. 51, pp. 1-42, Jan. 2005.
R.L. Wallace, et al., *Thin Silicon String Ribbon for High-Efficiency Polycrystalline Solar Cells*, IEEE, vol. 26, pp. 99-102, Sep. 1997.
N.L. Chalfin, *Filament Guides for Silicon-Ribbon Growth*, NASA Tech Brief, vol. 9, from JPL Invention Report, 5 pages, Jun. 1985.

* cited by examiner

*Primary Examiner*—Stuart Hendrickson
*Assistant Examiner*—Michelle Hou
(74) *Attorney, Agent, or Firm*—Sunstein Kann Murphy & Timbers LLP

(57) ABSTRACT

A string for use in a string ribbon crystal has a base portion with a refractory material, and an externally exposed layer radially outward of the refractory material. The base portion has a coefficient of thermal expansion that is generally matched with the coefficient of thermal expansion for silicon. The externally exposed layer has a contact angle with silicon of between about 15 and 120 degrees.

10 Claims, 5 Drawing Sheets

REDUCED WETTING STRING FOR RIBBON CRYSTAL

PRIORITY AND CROSS-REFERENCE TO RELATED APPLICATIONS

This patent application claims priority from provisional U.S. patent application No. 60/969,263, filed Aug. 31, 2007, entitled, "STRING RIBBON CRYSTAL AND STRING WITH IMPROVED EFFICIENCY," assigned and naming Christine Richardson, Lawrence Felton, Richard Wallace, and Scott Reitsma as inventors, the disclosure of which is incorporated herein, in its entirety, by reference.

This patent application also is related to the following copending, co-owned patent applications, filed on even date herewith, claiming the same priority as noted above and incorporated herein, in their entireties, by reference:

Ser. No. 12/201,117, entitled, "RIBBON CRYSTAL STRING FOR INCREASING WAFER YIELD," and Ser. No. 12/201,180, entitled, "RIBBON CRYSTAL STRING WITH EXTRUDED REFRACTORY MATERIAL."

FIELD OF THE INVENTION

The invention generally relates to string ribbon crystals and, more particularly, the invention also relates to string used to form string ribbon crystals.

BACKGROUND OF THE INVENTION

String ribbon crystals, such as those discussed in U.S. Pat. No. 4,689,109 (issued in 1987 and naming Emanuel M. Sachs as the sole inventor), can form the basis of a variety of electronic devices. For example, Evergreen Solar, Inc. of Marlborough, Mass. forms solar cells from conventional string ribbon crystals.

As discussed in greater detail in the noted patent, conventional processes form string ribbon crystals by passing two or more strings through molten silicon. The composition and nature of the string can have a significant impact on the efficiency and, in some instances, the cost of the ultimately formed string ribbon crystal.

SUMMARY OF THE INVENTION

In accordance with one embodiment of the invention, a string for use in a string ribbon crystal formed from a specific crystal material, such as one of silicon, silicon-germanium, gallium arsenide and indium phosphide, has a substrate and a refractory layer supported on the substrate. The string also has an externally exposed layer having a contact angle with the crystal material of between about 15 and 120 degrees. The externally exposed layer is radially outward of the refractory layer.

The string also may have a handling layer radially outward of the refractory layer. The handling layer applies a generally radially inward force to the refractory layer. The handling layer may include the externally exposed layer. Alternatively, the externally exposed layer may be radially outward of the handling layer.

The externally exposed layer may be formed from any of a number of materials that reduces wetting, such as pyrolytic carbon, oxide, and nitride. For example, the externally exposed layer may have a contact angle with the crystal material of greater than about 25 degrees. Moreover, the substrate may be formed from carbon, while the refractory layer may be formed from silicon carbide.

Various embodiments generally match the coefficient of thermal expansion. For example, the substrate, refractory layer, and exposed layer have a combined coefficient of thermal expansion that is substantially matched to the coefficient of thermal expansion of the crystal material. To further thermal matching, the exposed layer is thinner than the refractory layer. In a more specific embodiment, the string may have a coefficient of thermal expansion that is generally matched to the coefficient of thermal expansion of polysilicon.

In accordance with another embodiment, a string for use in a string ribbon crystal has a base portion with a refractory material, and an externally exposed layer radially outward of the refractory material. The base portion has a coefficient of thermal expansion that is generally matched with the coefficient of thermal expansion for silicon. The externally exposed layer has a contact angle with silicon of between about 15 and 120 degrees.

In accordance with other embodiments, a ribbon crystal has 1) a string with an outer surface, and 2) a body with a body material having a body coefficient of thermal expansion. The body coefficient of thermal expansion is generally matched to the coefficient of thermal expansion of the string. The string outer surface (i.e., the circumferential outer surface) also is partially exposed.

In accordance with yet other embodiments of the invention, a method of forming a string for use with a ribbon crystal forms a refractory layer on a substrate, and applies a reduced wetting material radially outward of the refractory layer. The reduced wetting material has a contact angle with silicon of between about 15 and 120 degrees.

In accordance with still other embodiments of the invention, a method of forming a ribbon crystal provides 1) molten material having a material coefficient of thermal expansion and 2) a string having an outer surface with a contact angle with the molten material of between about 15 and 120 degrees. The string also has a string coefficient of thermal expansion that is substantially matched to the material coefficient of thermal expansion. To form a sheet, the method passes the string through molten material.

BRIEF DESCRIPTION OF THE DRAWINGS

Those skilled in the art should more fully appreciate advantages of various embodiments of the invention from the following "Description of Illustrative Embodiments," discussed with reference to the drawings summarized immediately below.

DESCRIPTION OF ILLUSTRATIVE EMBODIMENTS

In illustrative embodiments, a string has a reduced wetting, outer exposed layer to increase grain size near the edge of a ribbon crystal. To that end, the string may have a contact angle of between about 15 and 120 degrees with the ribbon crystal material, such as single crystal or multi-crystal silicon. To improve ribbon robustness, the coefficient of thermal expansion of the string generally matches that of the material forming the ribbon crystal (e.g., silicon). Details of various embodiments are discussed below.

Figure 1:
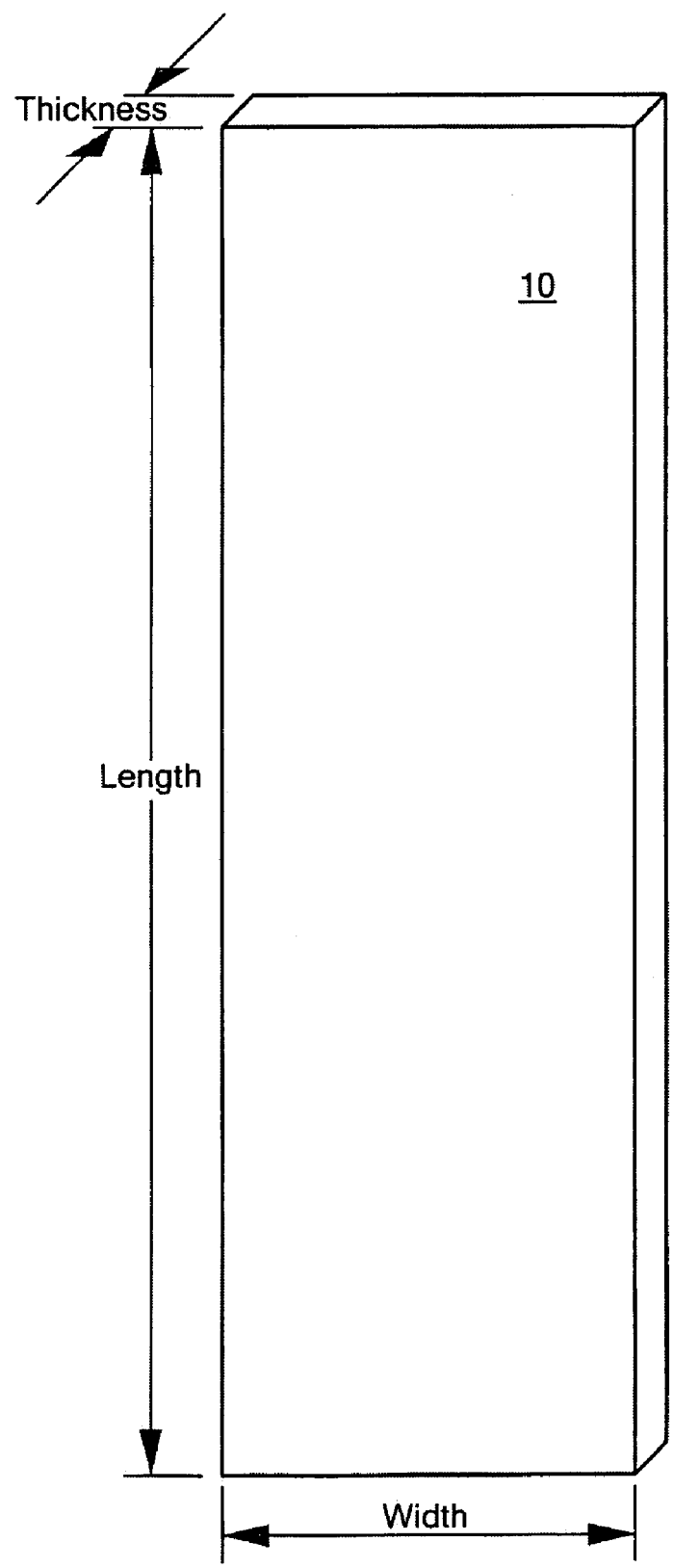
FIG. 1 schematically shows a string ribbon crystal that may be formed from strings configured in accordance with illustrative embodiments of the invention.

FIG. 1 schematically shows a string ribbon crystal 10 configured in accordance illustrative embodiments of the invention. In a manner similar to other ribbon crystals, this ribbon crystal 10 has a generally rectangular shape and a relatively large surface area on its front and back faces. For example, the ribbon crystal 10 may have a width of about 3 inches, and a length of about 6 inches. As known by those skilled in the art, the length can vary significantly. For example, in some known processes, the length depends upon a furnace operator's discretion as to where to cut the ribbon crystal 10 as it grows. In addition, the width can vary depending upon the separation of its two strings 12 (see FIG. 2) forming the ribbon crystal width boundaries. Accordingly, discussion of specific lengths and widths are illustrative and not intended to limit various embodiments the invention.

The thickness of the ribbon crystal 10 may vary and be very small relative to its length and width dimensions. For example, the string ribbon crystal 10 may have a thickness ranging from about 60 microns to about 320 microns across its width. Despite this range, the string ribbon crystal 10 may be considered to have an average thickness across its length and/or width.

The ribbon crystal 10 may be formed from any of a wide variety of materials (often referred to generally as "ribbon material" or "crystal material"), depending upon the application. For example, when grown for a photovoltaic application, the ribbon crystal 10 may be formed from a single element, such as silicon, or a compound, such as a silicon-based material (e.g., silicon germanium). Other illustrative ribbon materials may include gallium arsenide, or indium phosphide. The ribbon material may be any of a variety of crystal types, such as multi-crystalline, single crystalline, polycrystalline, microcrystalline or semi-crystalline.

As known by those skilled in the art, the ribbon crystal 10 is formed from a pair of strings 12 generally encapsulated by the ribbon material (e.g., polysilicon). Although it is surrounded by the ribbon material (in the prior art), the string 12 and ribbon material outwardly of the string 12 generally form the edge of the ribbon crystal 10. For simplicity, the ribbon crystal 10 is discussed as being formed from polysilicon. It nevertheless should be reiterated that this discussion of polysilicon is not intended to limit all embodiments.

Figure 2:
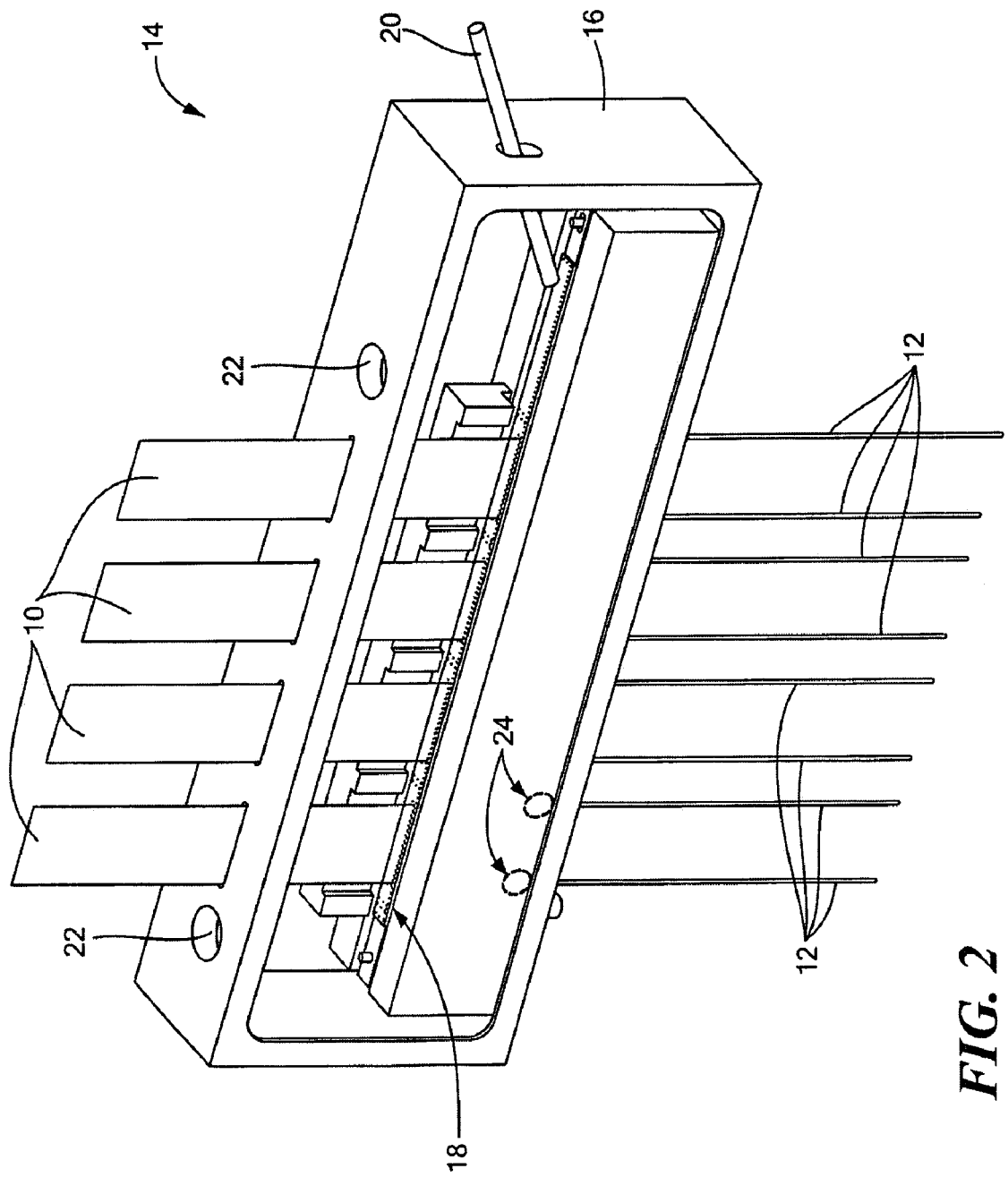
FIG. 2 schematically shows an illustrative furnace used to form string ribbon crystals.

Illustrative embodiments grow the ribbon crystal 10 in a ribbon crystal growth furnace 14, such as that shown in FIG. 2. More specifically, FIG. 2 schematically shows a silicon ribbon crystal growth furnace 14 that may be used to form the string ribbon crystal 10 in accordance with illustrative embodiments of the invention. The furnace 14 has, among other things, a housing 16 forming a sealed interior that is substantially free of oxygen (to prevent combustion). Instead of oxygen, the interior has some concentration of another gas, such as argon, or a combination of gasses. The housing interior also contains, among other things, a crucible 18 and other components for substantially simultaneously growing four silicon ribbon crystals 10. A feed inlet 20 in the housing 16 provides a means for directing silicon feedstock to the interior crucible 18, while an optional window 22 permits inspection of the interior components.

As shown, the crucible 18, which is supported on an interior platform within the housing 16, has a substantially flat top surface. This embodiment of the crucible 18 has an elongated shape with a region for growing silicon ribbon crystals 10 in a side-by-side arrangement along its length. In illustrative embodiments, the crucible 18 is formed from graphite and resistively heated to a temperature capable of maintaining silicon above its melting point. To improve results, the crucible 18 has a length that is much greater than its width. For example, the length of the crucible 18 may be three or more times greater than its width. Of course, in some embodiments, the crucible 18 is not elongated in this manner. For example, the crucible 18 may have a somewhat square shape, or a nonrectangular shape.

As shown in FIG. 2 and discussed in greater detail below, the furnace 14 has a plurality of holes 24 (shown in phantom) for receiving string 12. Specifically, the furnace 14 of FIG. 2 has eight string holes 24 for receiving four pairs of strings 12. Each pair of strings 12 passes through molten silicon in the crucible 18 to form a ribbon crystal 10.

The string 12 must have a wetting angle with silicon that is low enough to cause the molten ribbon material to adhere to its outer surface. Accordingly, some prior art ribbon crystals used in commercial solar panels, for example, use string having a wetting angle with silicon that is very small, such as on the order of about 11 degrees or less. While sufficient for many applications, those in the art noticed long ago that such string creates many small grains of ribbon material in the final product. Undesirably, these small grains reduce the electrical efficiency of the solar cell the crystal 10 ultimately forms.

Others have tried and failed to solve this long felt need in the art. For example, an article by Ciszek et al., entitled, "Filament Materials For Edge-Supported Pulling of Silicon Sheet Crystals," published by the Solar Energy Research Institute, Golden Colo., dated 1982 and 1983 and submitted with this patent application, addresses the phenomenon. In particular, this article discusses high contact angles of the string with the ribbon material (fifteen degrees or higher), but acknowledges yield problems with materials having such high contact angles. More specifically, the article notes breakage problems caused by coefficient of thermal expansion mismatches between the string and ribbon material. The article does not recognize any solution to this problem.

Rather than solve the problem, the Ciszek et al. article attempts to manage it. In particular, the article teaches use of a high contact angle (with silicon) string formed from a material having a coefficient of thermal expansion that is not matched to the ribbon material (e.g., quartz used with silicon ribbon material). They reason that a significant coefficient of thermal expansion mismatch will cause the string to break off, which it suggests is a good result. Such a solution, however, is very undesirable for many applications.

Accordingly, years after the Ciszek research, the inventors discovered how to obtain the benefits of a string with both a matched coefficient of thermal expansion and high contact angle with the ribbon material. To that end, generally speaking of various embodiments, the inventors solved of this long felt need by pursuing a solution that Ciszek teaches away from; namely, engineering string to have both a matched coefficient of thermal expansion and high contact angle. To that end, the inventors applied an exterior layer of material with a favorable contact angle onto a base string portion 26 having a matched coefficient of thermal expansion.

Figure 3A:
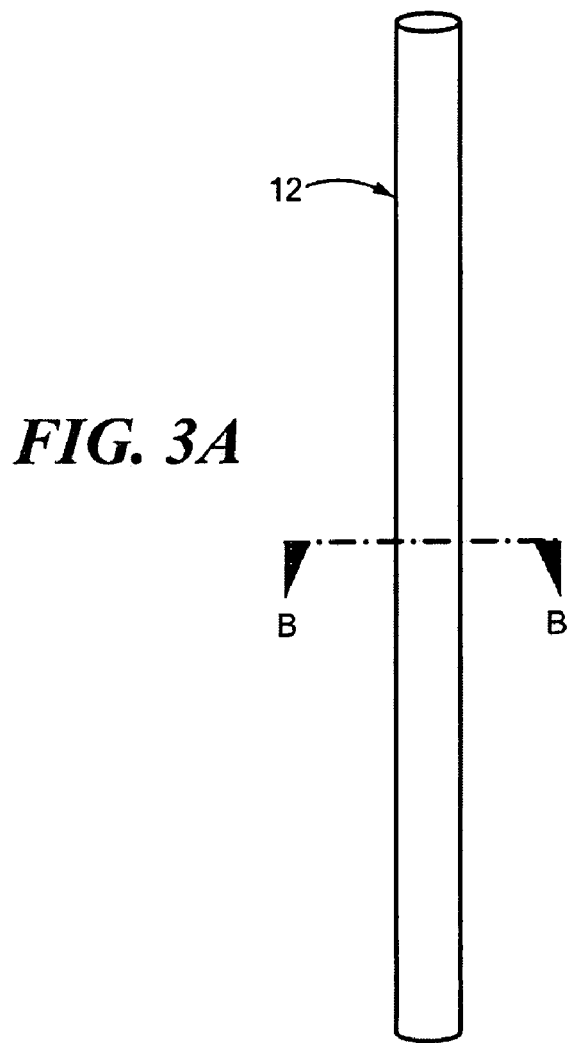
FIG. 3A schematically shows a string formed in accordance with illustrative embodiments of the invention.
Figure 3B:
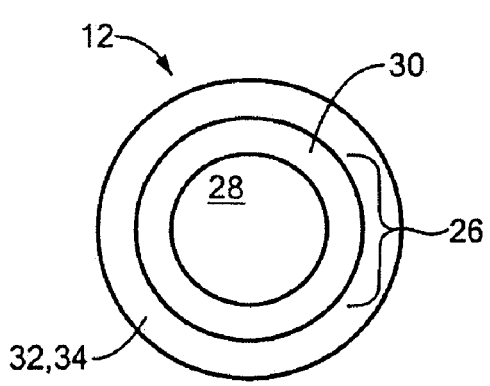
FIG. 3B schematically shows a cross-sectional view of the string of FIG. 3A along line B-B in accordance with one embodiment of the invention.
Figure 3C:
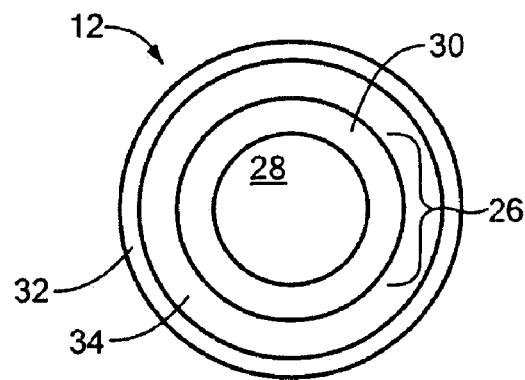
FIG. 3C schematically shows a cross-sectional view of the string of FIG. 3A along line B-B in accordance with another embodiment of the invention.

More specifically, FIG. 3A schematically shows a string 12 that may be formed in accordance with illustrative embodiments of the invention. FIG. 3B schematically shows a cross-sectional view of the string 12 of FIG. 3A along cross-line B-B in accordance with one embodiment, while FIG. 3C schematically shows a cross-sectional view of the string 12 in accordance with another embodiment. As shown, the string 12 in both embodiments has a base string portion 26 formed of a central core 28 and a substantially concentric, refractory material layer 30 (also referred to herein as a "refractory layer 30").

In some embodiments, the central core 28 is a conductive carbon formed from conventional extrusion processes. In other embodiments, the central core 28 is formed from a plurality of small conductive fibers (e.g., carbon fibers) that are wound together to form a tow. Moreover, the refractory material layer 30 may be formed from any conventional refractive material suitable for a given application. For example, the refractory material layer 30 may be formed from silicon carbide if used to form a photovoltaic cell from a silicon.

Illustrative embodiments of the string 12 also have an exposed, nonwetting layer 32 that, when used with string 12 having a circular or similarly symmetric cross-sectional shape, also is generally concentric with the core 28. Among other things, this nonwetting layer 32 may be a carbon, pyrolytic carbon/carbide (e.g., graphite), an oxide, or a nitride. More specifically, appropriate materials may include aluminum oxide, or silica. It is preferable that the materials selected to form this nonwetting layer 32 have no more than a negligible contaminating impact on the molten silicon within the crucible 18.

The inventors discovered that a very thin nonwetting layer 32 should minimize its impact on the coefficient of thermal expansion of the base string portion 26. Moreover, the nonwetting layer 32 should be thick enough to provide a robust outer surface that can withstand the demands of the ribbon crystal fabrication process. For example, a string 12 having a total cross-sectional dimension of about 140 microns can have a nonwetting layer 32 with a thickness of about one micron.

Although not explicitly discussed above, the string 12 also may have a handling layer 34 radially outward of the refractory material layer 30 to maintain the integrity of the base string portion 26. To that end, the handling layer 34 is formed to provide a small compressive stress to the base string portion 26, thus improving robustness to the overall string 12. Accordingly, if the base string portion 26 develops a crack, the compressive stress of the handling layer 34 should reduce the likelihood that the string 12 will break. Among other things, the handling layer 34 may be a thin layer of carbon (e.g., one or two microns thick for strings having generally known sizes).

The nonwetting layer 32 may be integrated directly into the handling layer 34, as shown in FIG. 3B. Alternative embodiments, however, may form the nonwetting layer 32 radially outward of the handling layer 34, as shown in FIG. 3C. Yet other embodiments may form the other layers between the nonwetting layer 32 and the base string portion 26, or omit the handling layer 34.

FIGS. 3B and 3C show string with generally circular cross-sectional shapes. Various embodiments of the string 12, however, may have cross-sectional shapes that are not generally circular. For example, the string 12 may have a concave cross-sectional shape (e.g., a cross or "c" shape), an elongated cross-sectional shape (e.g., an ellipse or rectangle), or other regular or irregular cross-sectional shape. As discussed in greater detail in co-pending patent applications having docket numbers 3253/173 and 3253/174 (identified and incorporated above), these embodiments may improve the robustness of the resulting ribbon crystals 10.

It should be noted that use of the term "nonwetting" layer is somewhat of a misnomer because if it truly was nonwetting, then the molten ribbon material would not adhere to it. The nonwetting layer 32 thus can be referred to as a reduced wetting layer, and alternatively may be referred to in that manner below.

Figure 4A:
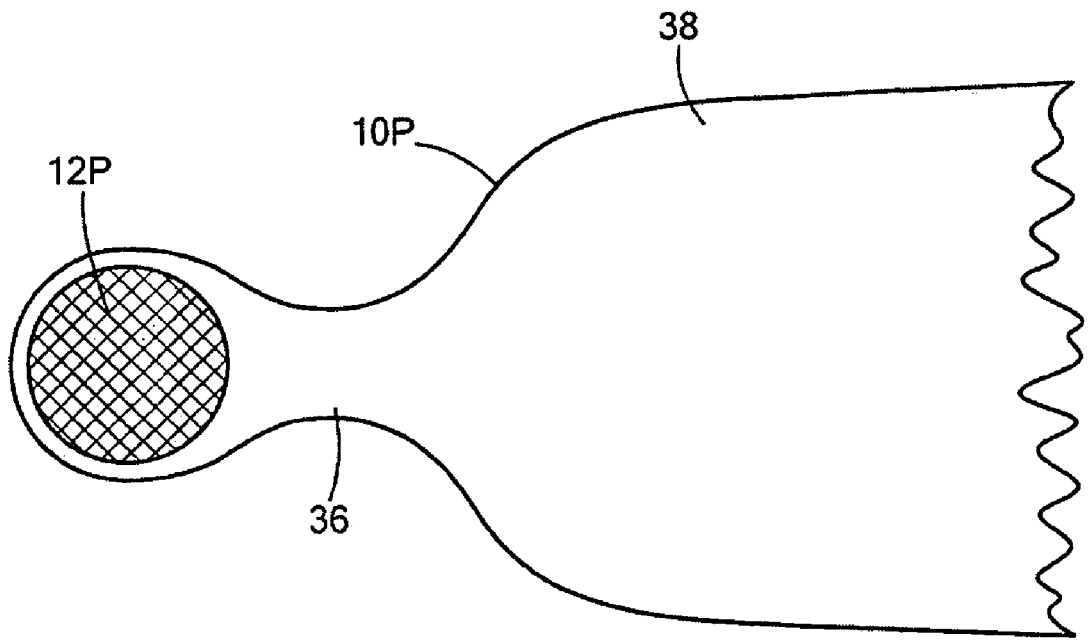
FIG. 4A schematically shows a cross-sectional view of a ribbon crystal using a prior art string.
Figure 4B:
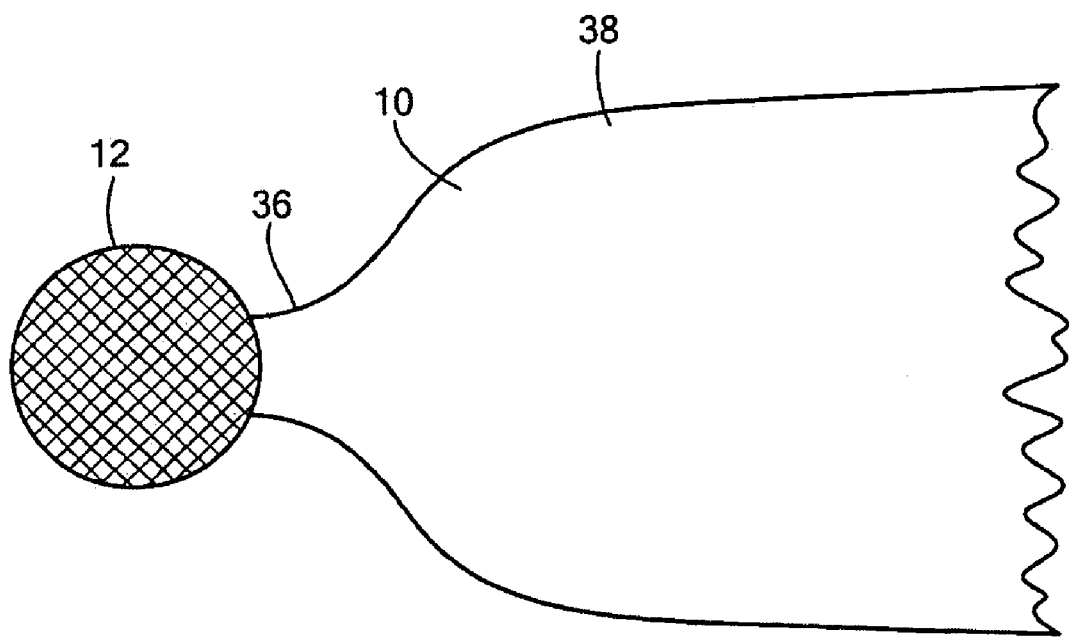
FIG. 4B schematically shows a cross-sectional view of a ribbon crystal using a string configured in accordance with illustrative embodiments of the invention.

FIGS. 4A and 4B graphically show a primary difference between prior art string and string 12 configured in accordance with illustrative embodiments of the invention. Specifically, FIG. 4A schematically shows a cross-sectional view of a portion of a prior art ribbon crystal 10P with a prior art string 12P. This prior art ribbon crystal 10P has a thin neck portion 36 between the string 12P and a wider portion 38. As shown, the ribbon material contacts and appears to substantially cover the entire outer surface of the string 12P. Undesirably, this significant surface contact produces many nucleation sites that, consequently, form a relatively high volume of small grains.

FIG. 4B schematically shows a new string 12 within a ribbon crystal 10. In a manner unlike the ribbon crystal 10P of FIG. 4A, the ribbon material of this figure does not contact the entire outer surface of the string 12. Instead, the ribbon material contacts only a portion of the outer surface, thus exposing a significant remaining portion. Accordingly, this embodiment presents fewer nucleation sites, thus favorably reducing the number of small grains near the string 12. In other words, this embodiment promotes larger grains near the strings 12. As a result, the efficiency of the string ribbon crystal 10 should be improved when compared to string ribbon crystals using strings 12 without a nonwetting layer 32.

Moreover, as noted above, the string 12 preferably has a diameter that is greater than the diameters of commonly used prior art strings. For example, larger strings 12 may have diameters ranging from about 0.75 to 2.0 times the average thickness of its corresponding string ribbon crystal 10. This larger diameter should effectively increase the thickness of the string ribbon crystal 10 in the region near the string 12. Consequently, the string ribbon crystal 10 should be less prone to breaking than some prior art designs using strings with smaller diameters. As an example, a single crystal 10 may have a thickness that varies between about 140 microns and 250 microns, and the string 12 may have a thickness that is between 0.75 and 2.0 times such thickness.

Figure 5:
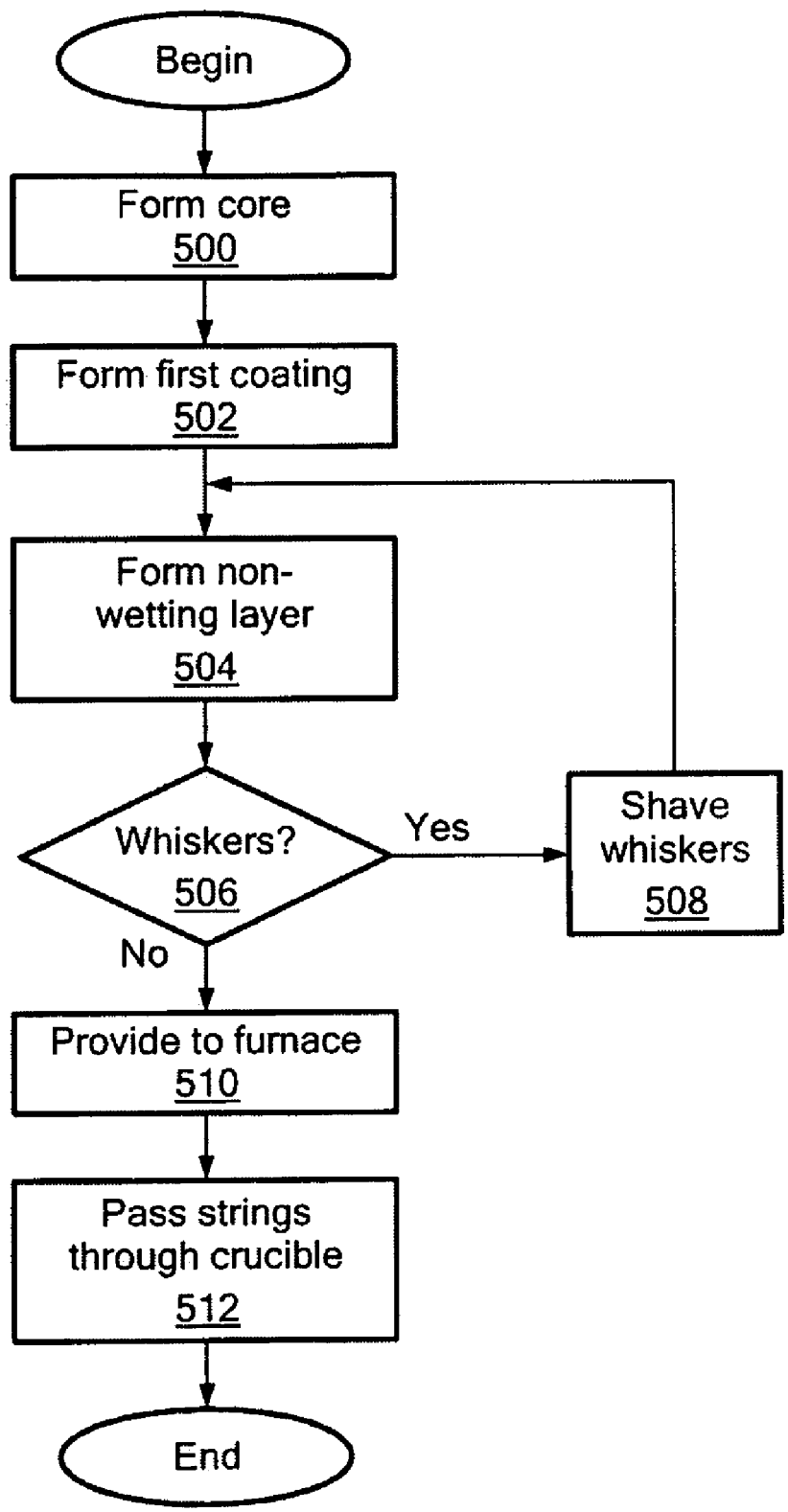
FIG. 5 shows an illustrative process of forming a string ribbon crystal using strings configured in accordance with illustrative embodiments of the invention.

FIG. 5 shows an illustrative process of forming a string ribbon crystal 10 with strings 12 configured in accordance with illustrative embodiments of the invention. The process begins at step 500 by forming the core/substrate 28. As noted above, the core 28 can be formed from carbon by conventional spinning processes. In other embodiments, however, the core 28 may be a wire, filament, or plurality of small conductive fibers wound together as a tow. For example, post-fabrication processes of a tow could form a monofilament through a known fabrication process, such as oxidation, carbonization, or infiltration.

After forming the core 28, the process forms a first coating/layer, which acts as the above noted refractory material layer 30 (step 502). Among other things, the first coating 30 may include silicon carbide, tungsten, or a combination of silicon carbide and tungsten. This first layer may be formed in a number of conventional ways, or by means of an extrusion process, a pulltrusion process, or both spinning of a refractory material with a polymer component, which subsequently is baked off. Among other things, processes may use at least one component of carbon, silicon, silicon carbide, silicon nitride, aluminum, mullite, silicon dioxide, BN particles, or fibers mixed with a polymer binder, coupled with extrusion/pulltrusion. This also may involve bicomponent extrusion of a core 28 with at least one silicon carbide, carbon, silicon, and a sheath with a least one of oxide, mullite, carbon, and/or silicon carbide. Accordingly, the core 28 effectively acts as a substrate for supporting the refractory material layer 30.

This step thus forms the base string portion 26. It should be reiterated that the base string portion 26 may be formed from any of a wide variety of materials, such as a graphite fiber or tow, a refractory material, such as tungsten or silicon carbide, or a combination thereof. In fact, some embodiments may form the base string portion 26 without a core 28.

At this point in the process, the base string portion 26 has a combined coefficient of thermal expansion that should generally match the coefficient of thermal expansion of the ribbon material. Specifically, the thermal expansion characteristics of the string 12 should be sufficiently well matched to the ribbon material so that excessive stress does not develop at the interface. Stress is considered excessive if the string 12 exhibits a tendency to separate from the ribbon during reasonable subsequent ribbon crystal handling and processing steps, or if the string 12 exhibits a tendency to curl outwardly or inwardly from the ribbon crystal edge.

The process then continues to step 504, which forms the exposed nonwetting/reduced layer 32 on the base string portion 26. As discussed above, this layer could also serve as the handling layer 34 and preferably is very thin so that it has a negligible impact on the overall string coefficient of thermal expansion. For example, the reduced wetting layer 32 should be much thinner than that of the refractory material layer 30.

As also discussed above, the contact angle with the ribbon material of the exterior surface formed by this layer should be carefully controlled to cause the molten ribbon material to adhere to a portion of it only (as shown in FIG. 4B). In applications using molten polysilicon, for example, it is anticipated that contact angles with silicon of between about 15 and 120° degrees should produce satisfactory results. Such angles of greater than 25 degrees may produce even better results.

Among other ways, the nonwetting layer 32 may be formed by CVD processes, dip coating or other methods. For example, the base string portion 26 may be CVD coated by applying electrical contacts in a deposition chamber while it is being fed through the chamber—thus heating the base string portion 26 itself. Alternatively, the base string portion 26 may be heated by induction heating through the chamber.

Related techniques for implementing this step include:
- a sol gel dip for silica or alumina oxide or silicon oxycarbide either at the end of a CVD furnace or during rewind,
- a CVD nonwetting coating deposited by heating quartz from the outside and induction heating the base string portion 26,
- spray-on deposition with a polymer binder that subsequently would be burned off,
- shaking particles onto a base string portion 26 or tow and then baking the into the base string portion or tow, and
- coating with base string portion 26 with refractory slurry (e.g., silicon dioxide) or liquid and then burning off residual.

Prior to performing step 504, some embodiments form a handling layer 34 that is separate from the produced nonwetting layer 32, as discussed above. Accordingly, in such an embodiment, the nonwetting wetting layer 32 substantially covers the handling layer 34. More specifically, the nonwetting layer 32 covers the outer, circumferential surface of the handling layer 34.

It then is determined at step 506 if the coated string 12 has filaments extending through the nonwetting layer 32 (such filaments are referred to herein as "whiskers"). This can occur, for example, when a tow of filaments forms the core 28. If the coated string 12 has whiskers, then the process shaves them off at step 508. The process then may loop back to step 504, which re-applies the nonwetting layer 32.

Alternatively, if the string 12 has no whiskers, the process continues to step 510, which provides the string 12 to the furnace 14 as shown in FIG. 2. At this point, for each ribbon crystal being formed, the process passes two strings 12 through the furnace 14 and crucible 18, thus forming the string ribbon crystal 10 (step 512).

Accordingly, illustrative embodiments increase the grain sizes near the string 12, thus improving electrical efficiency of the ribbon crystals. By using a technique for matching the coefficient of thermal expansion with the ribbon material, the inventors were able to achieve this goal without increasing yield loss.

Although the above discussion discloses various exemplary embodiments of the invention, it should be apparent that those skilled in the art can make various modifications that will achieve some of the advantages of the invention without departing from the true scope of the invention.

What is claimed is:

1. A string for use in a string ribbon crystal comprising a crystal material, the crystal material being one of silicon, silicon-germanium, gallium arsenide and indium phosphide, the string comprising:
   a substrate;
   a refractory layer supported on the substrate;
   an externally exposed layer having a contact angle with the crystal material of between about 15 and 120 degrees, the externally exposed layer being radially outward of the refractory layer; and
   a handling layer radially outward of the refractory layer, the handling layer applying a generally radially inward force to the refractory layer.

2. The string as defined by claim 1 wherein the handling layer includes the externally exposed layer.

3. The string as defined by claim 1 wherein the externally exposed layer is radially outward of the handling layer.

4. The string as defined by claim 1 wherein the externally exposed layer comprises at least one of pyrolytic carbon, oxide, and nitride.

5. The string as defined by claim 1 wherein the externally exposed layer has a contact angle with the crystal material of greater than about 25 degrees.

6. The string as defined by claim 1 wherein the substrate comprises carbon, the refractory layer comprising silicon carbide.

7. The string as defined by claim 1 wherein the crystal material has a material coefficient of thermal expansion, the substrate, refractory layer, and exposed layer having a combined coefficient of thermal expansion that is substantially matched to the material coefficient of thermal expansion.

8. The string as defined by claim 1 wherein the exposed layer is thinner than the refractory layer.

9. The string as defined by claim 1 wherein the string has a coefficient of thermal expansion that is generally matched to the coefficient of thermal expansion of polysilicon.

10. The string as defined by claim 1, wherein the handling layer has a contact angle with the crystal material of between about 15 and 120 degrees.

* * * * *